US008162510B2

(12) United States Patent
Wang et al.

(10) Patent No.: US 8,162,510 B2
(45) **Date of Patent: *Apr. 24, 2012**

(54) LED CHIP PACKAGE STRUCTURE WITH MULTIFUNCTIONAL INTEGRATED CHIPS AND A METHOD FOR MAKING THE SAME

(75) Inventors: Bily Wang, Hsinchu (TW); Shih-Yu Wu, Banciao (TW); Wen-Kuei Wu, Hukou Township, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 571 days.

This patent is subject to a terminal disclaimer.

(21) Appl. No.: 12/285,027

(22) Filed: Sep. 29, 2008

(65) Prior Publication Data

US 2009/0212304 A1 Aug. 27, 2009

(30) Foreign Application Priority Data

Feb. 22, 2008 (TW) ................................ 97106385 A

(51) Int. Cl.
*H01L 33/00* (2010.01)

(52) U.S. Cl. ............ 362/276; 362/800; 257/88; 257/98; 257/99; 257/E33.061

(58) Field of Classification Search .................. 362/276, 362/800

See application file for complete search history.

(56) References Cited

U.S. PATENT DOCUMENTS

| | | | | |
|---|---|---|---|---|
| 6,921,926 | B2 * | 7/2005 | Hsu | 257/98 |
| 7,834,365 | B2 * | 11/2010 | Wang et al. | 257/88 |
| 2004/0061433 | A1 * | 4/2004 | Izuno et al. | 313/498 |
| 2005/0207165 | A1 * | 9/2005 | Shimizu et al. | 362/362 |
| 2006/0087843 | A1 * | 4/2006 | Setomoto et al. | 362/249 |
| 2006/0138436 | A1 * | 6/2006 | Chen et al. | 257/98 |
| 2006/0157724 | A1 * | 7/2006 | Fujita | 257/99 |
| 2009/0065789 | A1 * | 3/2009 | Wang et al. | 257/88 |
| 2009/0128732 | A1 * | 5/2009 | Hamada | 349/58 |

FOREIGN PATENT DOCUMENTS

WO WO 2007129419 A1 * 11/2007

* cited by examiner

*Primary Examiner* — Fernando L Toledo
*Assistant Examiner* — John P Dulka
(74) *Attorney, Agent, or Firm* — Rosenberg, Klein & Lee

(57) ABSTRACT

A LED chip package structure with multifunctional integrated chips includes a substrate unit, a light-emitting unit, a chip unit, and a package colloid unit. The light-emitting unit has a plurality of LED chips electrically arranged on the substrate unit. The chip unit is electrically arranged on the substrate unit, and the chip unit is arranged between the light-emitting unit and a power source. The package colloid unit covers the LED chips. The package colloid unit is a strip fluorescent colloid corresponding to the LED chips.

2 Claims, 16 Drawing Sheets

LED CHIP PACKAGE STRUCTURE WITH MULTIFUNCTIONAL INTEGRATED CHIPS AND A METHOD FOR MAKING THE SAME

BACKGROUND OF THE INVENTION

1. Field of the Invention

The present invention relates to a LED chip package structure and a method for making the same, and particularly relates to a LED chip package structure with multifunctional integrated chips and a method for making the same.

2. Description of the Related Art

FIG. 1 shows a flowchart of a method for making LED chip package structure of the prior art. The known method includes: providing a plurality of packaged LEDs that have been packaged (S100); providing a strip substrate body that has a positive electrode trace and a negative electrode trace (S102); and then arranging each packaged LED on the strip substrate body in sequence and electrically connecting a positive electrode and a negative electrode of each packaged LED with the positive electrode trace and the negative electrode trace of the substrate body (S104).

However, with regard to the known first method, each packaged LED needs to be firstly cut from an entire LED package structure, and then each packaged LED is arranged on the strip substrate body via a surface mount technology (SMT) process. Hence, the known first packaging process is time-consuming. Moreover, there are no protection devices set in the LED chip package structure of the prior art, so that the LED chip package structure can enter some unstable state when the LED chip package structure is working.

SUMMARY OF THE INVENTION

The present invention provides a LED chip package structure with multifunctional integrated chips and a method for making the same. The present invention provides a chip unit for protecting LED chips integratedly set in a chip package structure to form the LED chip package structure with multifunctional integrated chips. Hence, the LED chips not only can be protected by the chip unit, but also can generate light source with high efficiency and increase usage life of the LED chip package structure.

Moreover, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

A first aspect of the present invention is a chip package structure with multifunctional integrated chips, including: a substrate unit, a light-emitting unit, a chip unit, and a package colloid unit.

Furthermore, the light-emitting unit has a plurality of LED chips electrically arranged on the substrate unit. The chip unit is electrically arranged on the substrate unit, and the chip unit is arranged between the light-emitting unit and a power source. The package colloid unit covers the LED chips.

Moreover, the LED chip package structure of the present invention further includes seven embodiments, as follows:

First embodiment: The package colloid unit is a strip fluorescent colloid corresponding to the LED chips.

Second embodiment: The package colloid unit is a strip fluorescent colloid corresponding to the LED chips, and the strip fluorescent colloid has a colloid cambered surface formed on its top surface and a colloid light-exiting surface formed on its front surface. In addition, a frame unit covers the strip fluorescent colloid for exposing the lateral side of the strip fluorescent colloid only.

Third embodiment: The package colloid unit has a plurality of fluorescent colloids corresponding to the LED chips.

Fourth embodiment: The package colloid unit has a plurality of fluorescent colloids corresponding to the LED chips. A frame unit has a plurality of frame layers, and each frame layer is formed around the lateral side of each fluorescent colloid for exposing the top surface of each fluorescent colloid only.

Fifth embodiment: The package colloid unit has a plurality of fluorescent colloids corresponding to the LED chips. A frame unit is formed around the lateral sides of the fluorescent colloids for exposing the top surface of each fluorescent colloid only.

Sixth embodiment: The package colloid unit has a plurality of fluorescent colloids corresponding to the LED chips, and each fluorescent colloid has a colloid cambered surface formed on its top surface and a colloid light-exiting surface formed on its front surface. A frame unit has a plurality of frame layers respectively covering the fluorescent colloids for exposing the lateral sides of the fluorescent colloids only.

Seventh embodiment: The package colloid unit has a plurality of fluorescent colloids corresponding to the LED chips, and each fluorescent colloid has a colloid cambered surface formed on its top surface and a colloid light-exiting surface formed on its front surface. A frame unit covers the fluorescent colloids for exposing the lateral sides of the fluorescent colloids only.

A second aspect of the present invention is a method for making a chip package structure with multifunctional integrated chips, including: providing a substrate unit; electrically arranging a light-emitting unit on the substrate unit, and the light-emitting unit having a plurality of LED chips; electrically arranging a chip unit on the substrate unit, and the chip unit being arranged between the light-emitting unit and a power source; and covering the LED chips with a package colloid unit.

Moreover, the method of the present invention further includes seven embodiments, as follows:

First embodiment: The package colloid unit is a strip fluorescent colloid corresponding to the LED chips.

Second embodiment: The package colloid unit is a strip fluorescent colloid corresponding to the LED chips, and the strip fluorescent colloid has a colloid cambered surface formed on its top surface and a colloid light-exiting surface formed on its front surface. In addition, the method further includes: providing a frame unit that covers the strip fluorescent colloid for exposing the lateral side of the strip fluorescent colloid only.

Third embodiment: The package colloid unit has a plurality of fluorescent colloids corresponding to the LED chips.

Fourth embodiment: The package colloid unit has a plurality of fluorescent colloids corresponding to the LED chips. In addition, the method further includes: providing a frame unit that has a plurality of frame layers, and each frame layer is formed around the lateral side of each fluorescent colloid for exposing the top surface of each fluorescent colloid only.

Fifth embodiment: The package colloid unit has a plurality of fluorescent colloids corresponding to the LED chips. In addition, the method further includes: providing a frame unit that is formed around the lateral sides of the fluorescent colloids for exposing the top surface of each fluorescent colloid only.

Sixth embodiment: The package colloid unit has a plurality of fluorescent colloids corresponding to the LED chips, and each fluorescent colloid has a colloid cambered surface formed on its top surface and a colloid light-exiting surface formed on its front surface. In addition, the method further includes: providing a frame unit that has a plurality of frame layers respectively covering the fluorescent colloids for exposing the lateral sides of the fluorescent colloids only.

Seventh embodiment: The package colloid unit has a plurality of fluorescent colloids corresponding to the LED chips, and each fluorescent colloid has a colloid cambered surface formed on its top surface and a colloid light-exiting surface formed on its front surface. In addition, the method further includes: providing a frame unit that covers the fluorescent colloids for exposing the lateral sides of the fluorescent colloids only.

Therefore, the LED chips not only can be protected by the chip unit, but also can generate light source with high efficiency and increase usage life of the LED chip package structure. Furthermore, because the LED chips are arranged on a substrate body via an adhesive or a hot pressing method, the process for the LED chip package structure is simple and less time is needed for the manufacturing process.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED BEST MODES

Figure 1:
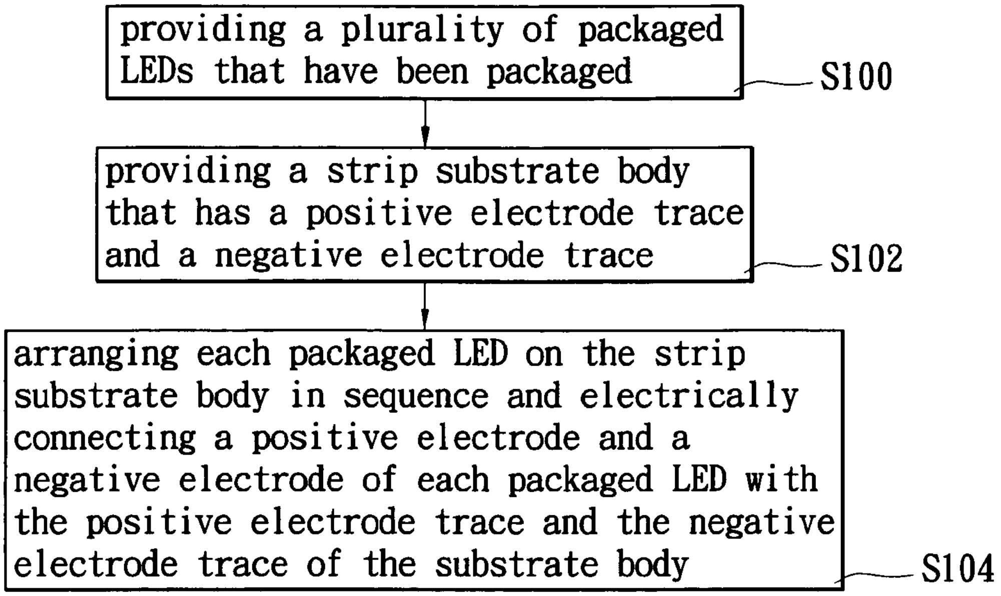
FIG. 1 PRIOR ART
FIG. 1 is a flowchart of a method for making a chip package structure of the prior art.
Figure 2:
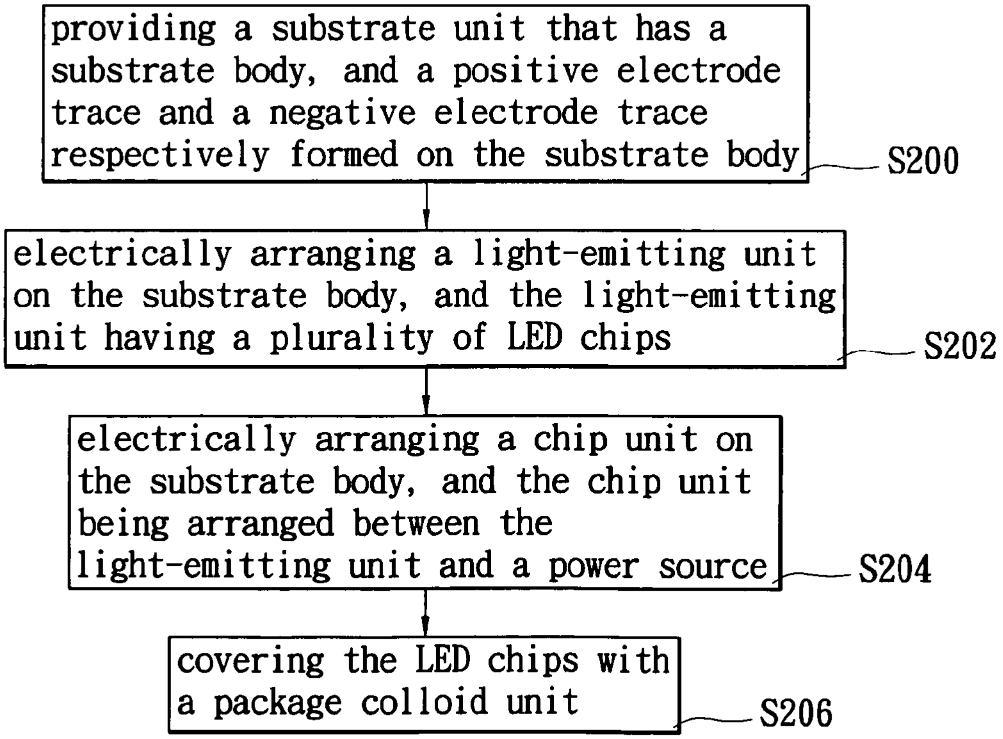
FIG. 2 is a flowchart of a method of making a chip package structure with multifunctional integrated chips according to the first embodiment of present invention.
Figure 2A:
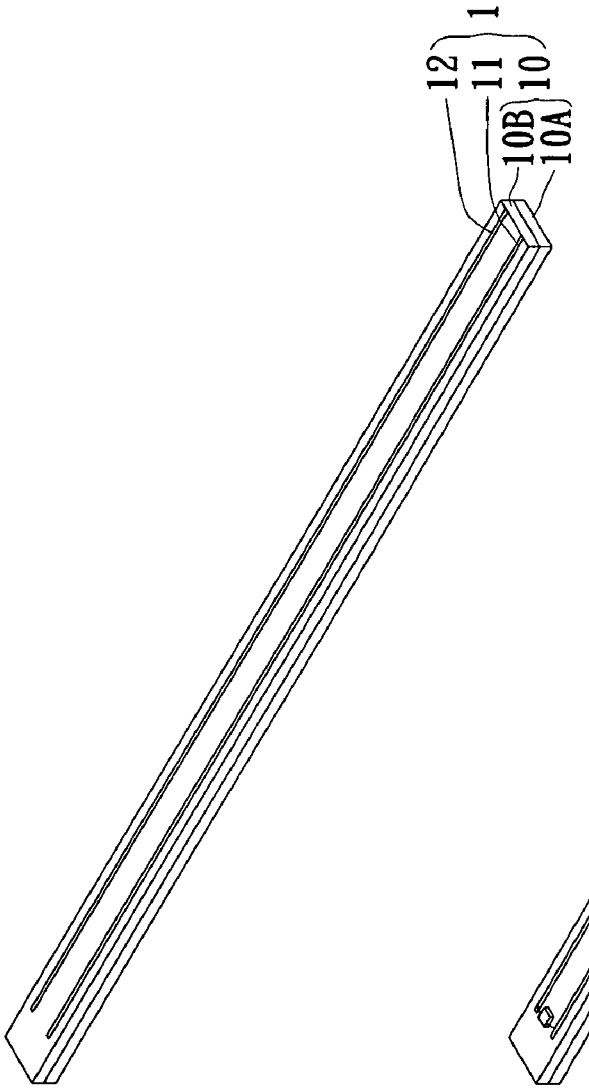
FIGS. 2A to 2C are schematic diagrams of a chip package structure with multifunctional integrated chips according to the first embodiment of the present invention, at different stages of the packaging processes, respectively.

Referring to FIGS. 2, 2A to 2C and 2D, the first embodiment provides a method for making a chip package structure with multifunctional integrated chips, including as follows:

Step S200 is: referring to FIGS. 2 and 2A, providing a substrate unit 1 that has a substrate body 10, and a positive electrode trace 11 and a negative electrode trace 12 respectively formed on the substrate body 10.

Moreover, the substrate unit 1 can be a PCB (Printed Circuit Board), a flexible substrate, an aluminum substrate, a ceramic substrate, or a copper substrate according to user's requirement. In addition, the substrate body 10 has a metal layer 10A and a bakelite layer 10B formed on the metal layer 10A. Both the positive electrode trace 11 and the negative electrode trace 12 can be aluminum circuits or silver circuits.

Figure 2B:
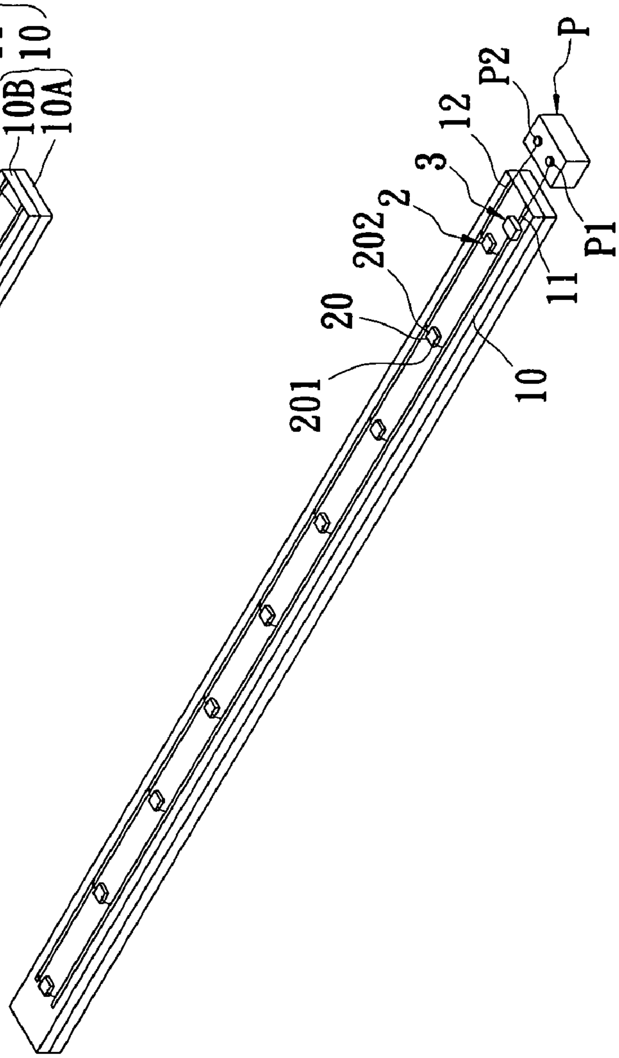

Step S202 is: referring to FIGS. 2 and 2B, electrically arranging a light-emitting unit 2 on the substrate body 10, and the light-emitting unit 2 having a plurality of LED chips 20. In addition, step S204 is: electrically arranging a chip unit 3 on the substrate body 10, and the chip unit 3 being arranged between the light-emitting unit 2 and a power source P. The power source P has a positive electrode P1 and a negative electrode P2 electrically connected with the positive electrode trace 11 and the negative electrode trace 12, respectively.

Furthermore, each LED chip 20 has a positive electrode 201 and a negative electrode 202 respectively and electrically connected with the positive electrode trace 11 and the negative electrode trace 12 of the substrate unit 1. In addition, the chip unit 3 can be a constant-current chip, a PWM (Pulse Width Modulation) control chip, a zone control chip, an OTP (Over-Temperature Protection) chip, an OCP (Over-Current Protection) chip, an OVP (Over-Voltage Protection) chip, an Anti-EMI (Anti-Electromagnetic Interference) chip, or an Anti-ESD (Anti-Electrostatic Discharge) chip; alternatively, the chip unit 3 can be selected from the group consisting of a constant-current chip, a PWM control chip, a zone control chip, an OTP chip, an OCP chip, an OVP chip, an Anti-EMI chip, and an Anti-ESD chip, according to different design requirements.

Figure 3A:
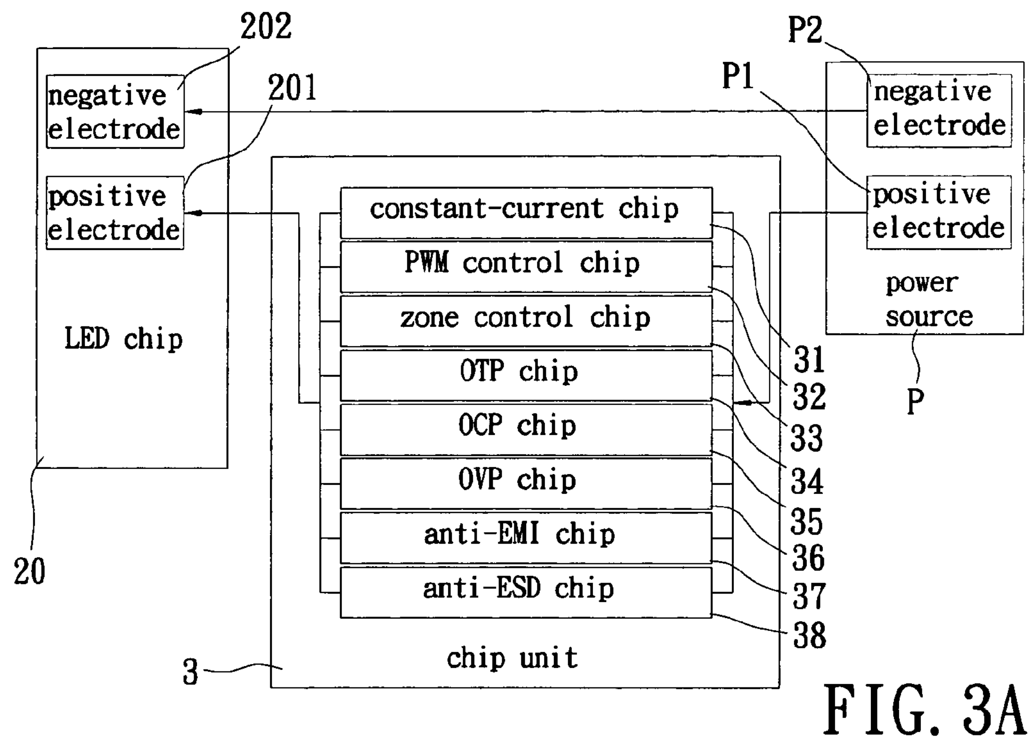
FIG. 3A is a schematic view of a first arrangement of a chip unit according to present invention.
Figure 3B:
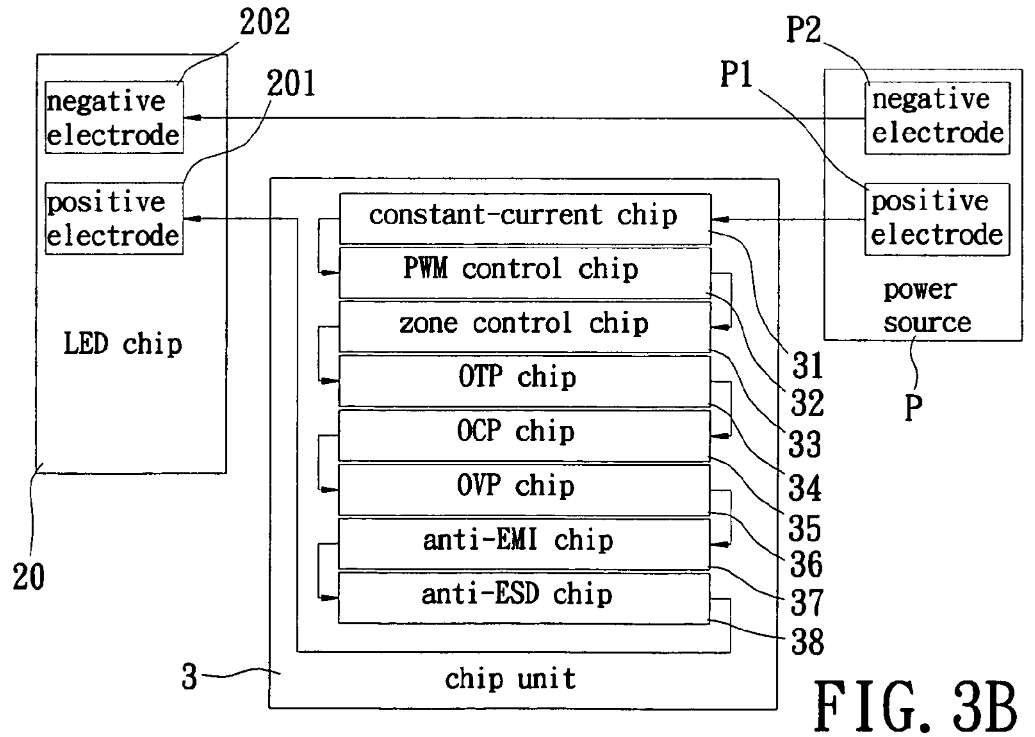
FIG. 3B is a schematic view of a second arrangement of a chip unit according to present invention.

Referring to FIGS. 3A and 3B, the chip unit 3 is composed of a constant-current chip 31, a PWM control chip 32, a zone control chip 33, an OTP chip 34, an OCP chip 35, an OVP chip 36, an Anti-EMI chip 37, and an Anti-ESD chip 38. In addition, the constant-current chip 31, the PWM control chip 32, the zone control chip 33, the OTP chip 34, the OCP chip 35, the OVP chip 36, the Anti-EMI chip 37, and the Anti-ESD chip 38 are electrically and parallelly connected to each other (as shown in FIG. 3A); alternatively, the constant-current chip 31, the PWM control chip 32, the zone control chip 33, the OTP chip 34, the OCP chip 35, the OVP chip 36, the Anti-EMI chip 37, and the Anti-ESD chip 38 are electrically and seriesly connected to each other (as shown in FIG. 3B).

Figure 2C:
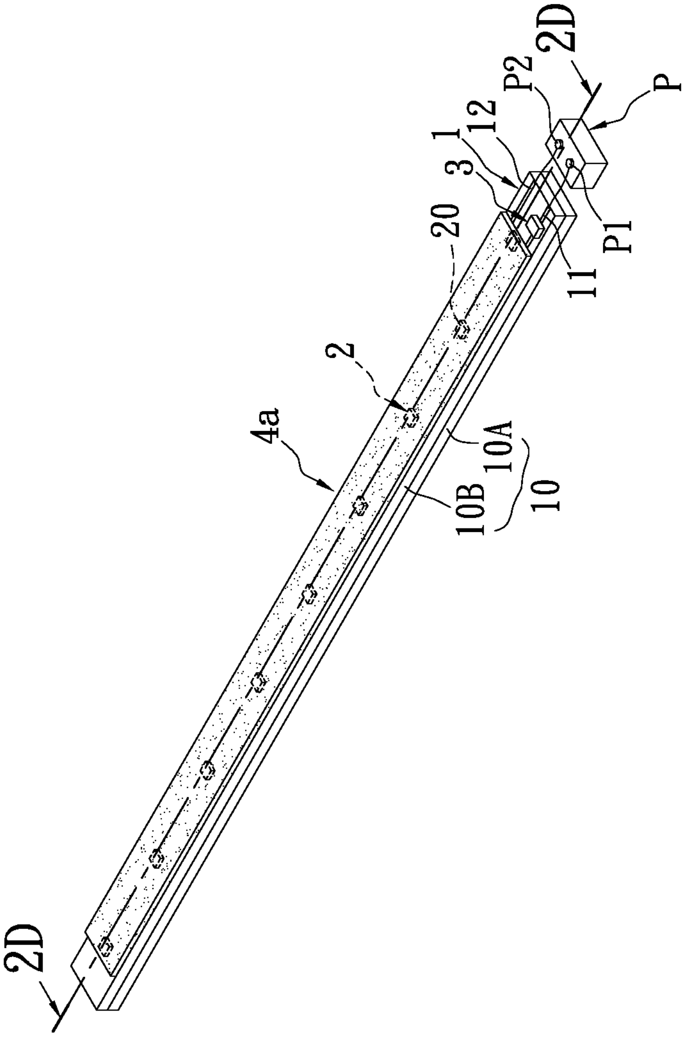
Figure 2D:
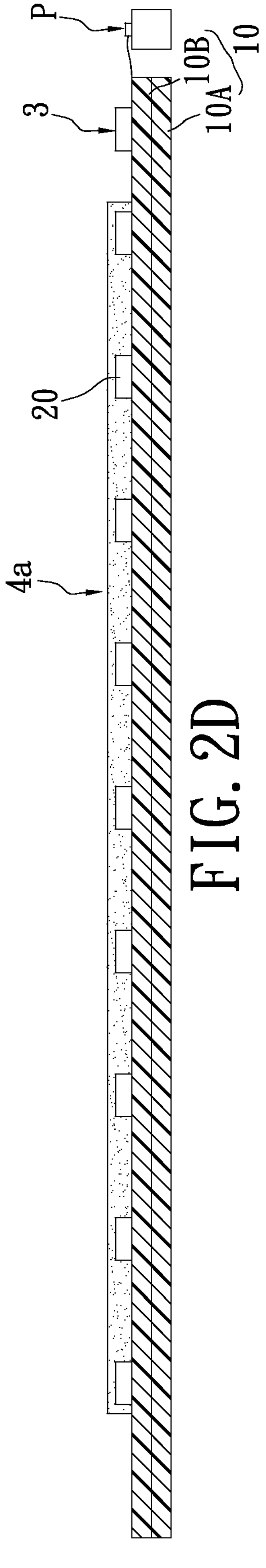
FIG. 2D is a cross-sectional view along line 2D-2D in FIG. 2C.

Step S206 is: referring to FIGS. 2, 2C and 2D, covering the LED chips 20 with a package colloid unit 4*a*. In addition, the package colloid unit 4*a* is a strip fluorescent colloid corresponding to the LED chips 20. The strip fluorescent colloid is formed by mixing silicon and fluorescent powders or mixing epoxy and fluorescent powders.

Referring to FIGS. 4, 4A to 4B and 4C, the steps from S300 to S304 of the second embodiment are same as the steps from S200 to S204 of the first embodiment. In other words, the illustration of S300 is the same as FIG. 2A of the first embodiment, and the illustrations of S302, S304 are the same as FIG. 2B of the first embodiment.

Figure 4:
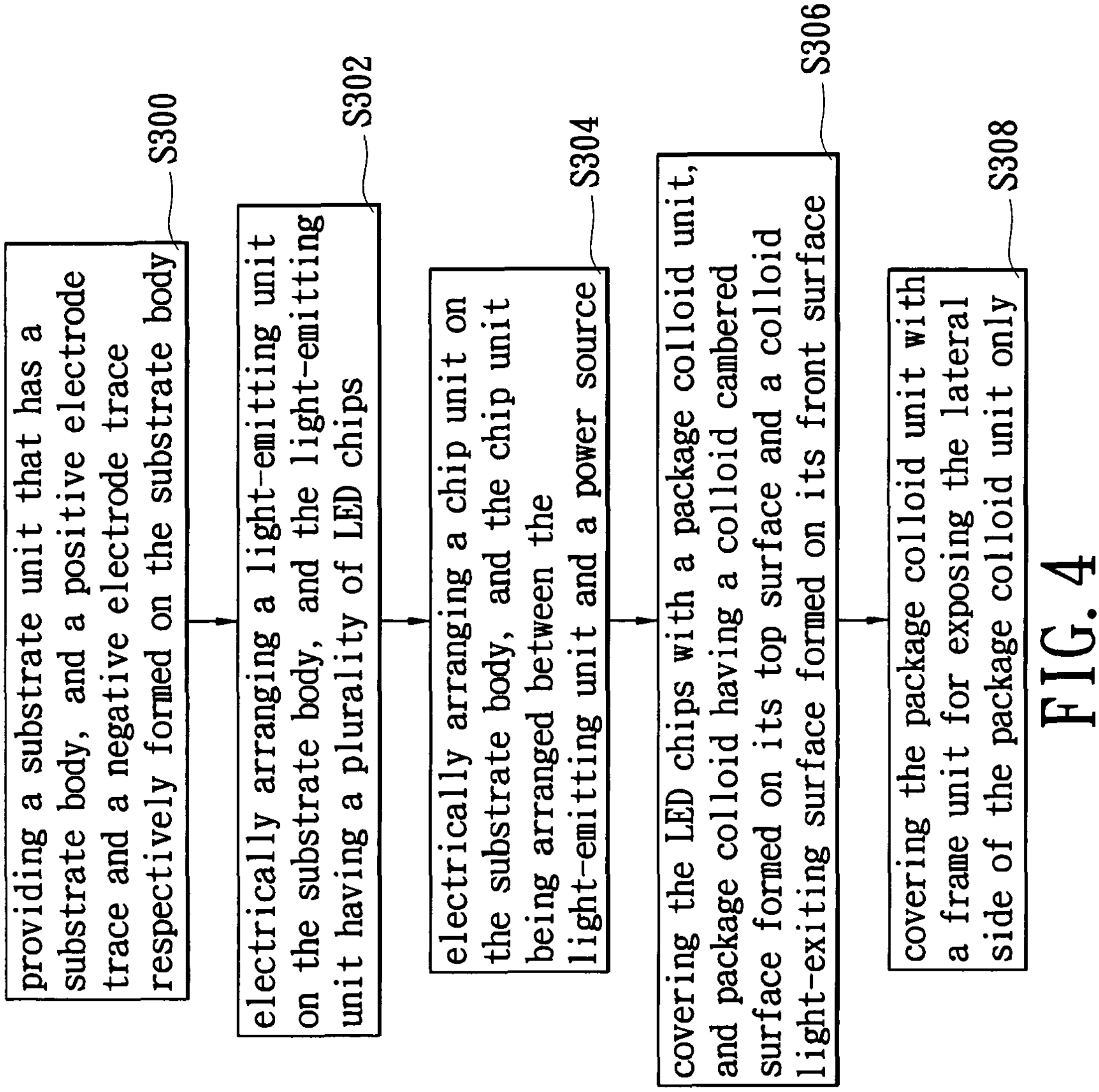
FIG. 4 is a flowchart of a method of making a chip package structure with multifunctional integrated chips according to the second embodiment of present invention.
Figure 4B:
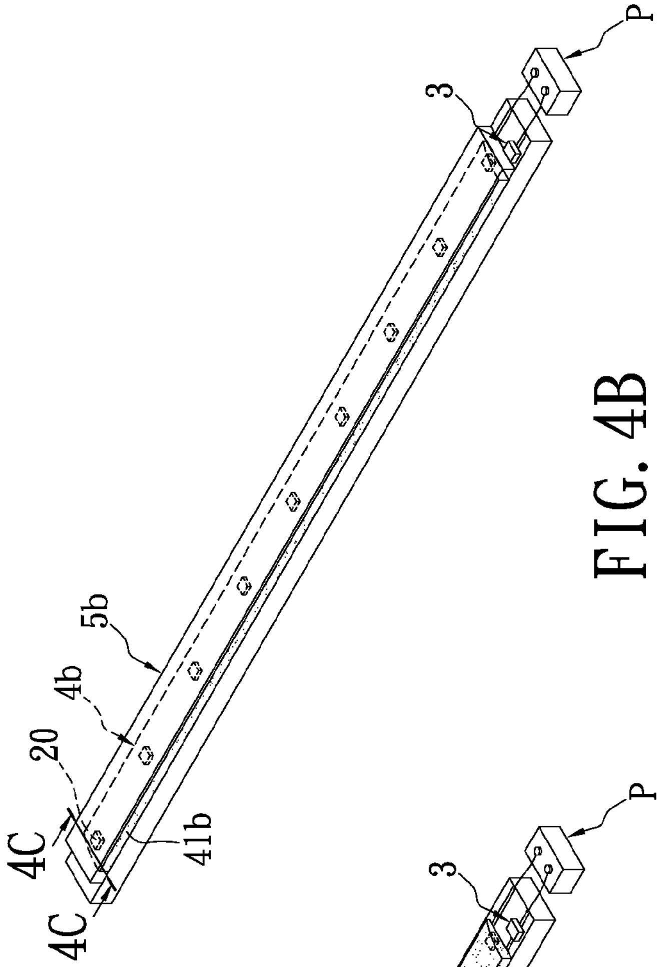
FIGS. 4A to 4B are schematic diagrams of a chip package structure with multifunctional integrated chips according to the second embodiment of the present invention, at different partial stages of the packaging processes, respectively.
Figure 4A:
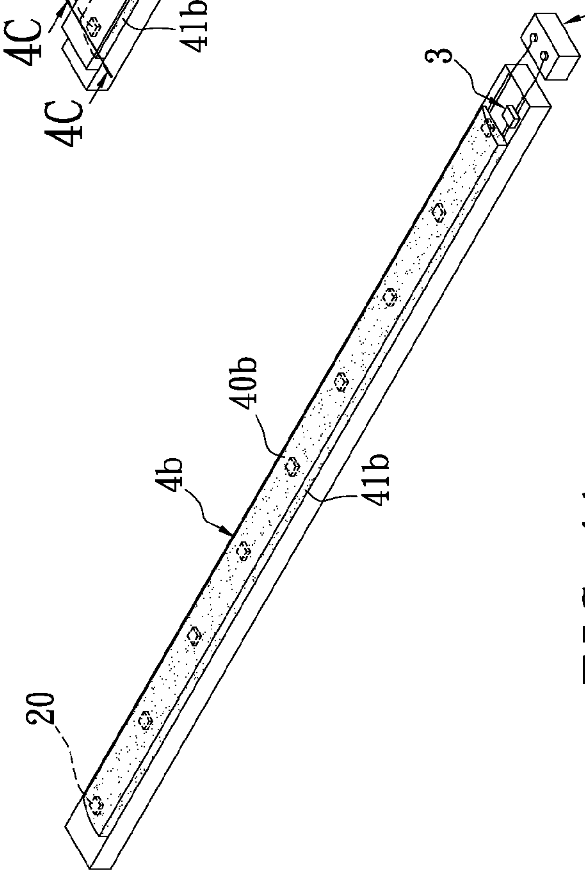

Step S306 is: referring to FIGS. 4 and 4A, after the step of S304, the method of the second embodiment further includes: covering the LED chips 20 with a package colloid unit 4*b*, and package colloid 4*b* having a colloid cambered surface 40*b* formed on its top surface and a colloid light-exiting surface 41*b* formed on its front surface. In addition, the package colloid unit 4*b* is a strip fluorescent colloid corresponding to the LED chips 20. Therefore, the strip fluorescent colloid has the colloid cambered surface 40*b* formed on its top surface and the colloid light-exiting surface 41*b* formed on its front surface.

Figure 4C:
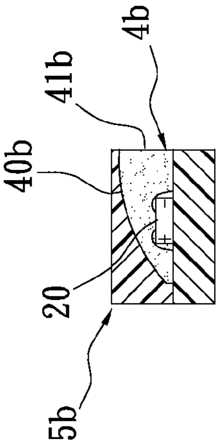
FIG. 4C is a cross-sectional view along line 4C-4C in FIG. 4B.

Step S308 is: referring to FIGS. 4, 4B and 4C, covering the package colloid unit 4*b* (the strip fluorescent colloid) with a frame unit 5*b* for exposing the lateral side (the colloid light-exiting surface 41*b*) of the package colloid unit 4*b* (the strip fluorescent colloid) only. In addition, the frame unit 5*b* can be an opaque frame layer.

Figure 5:
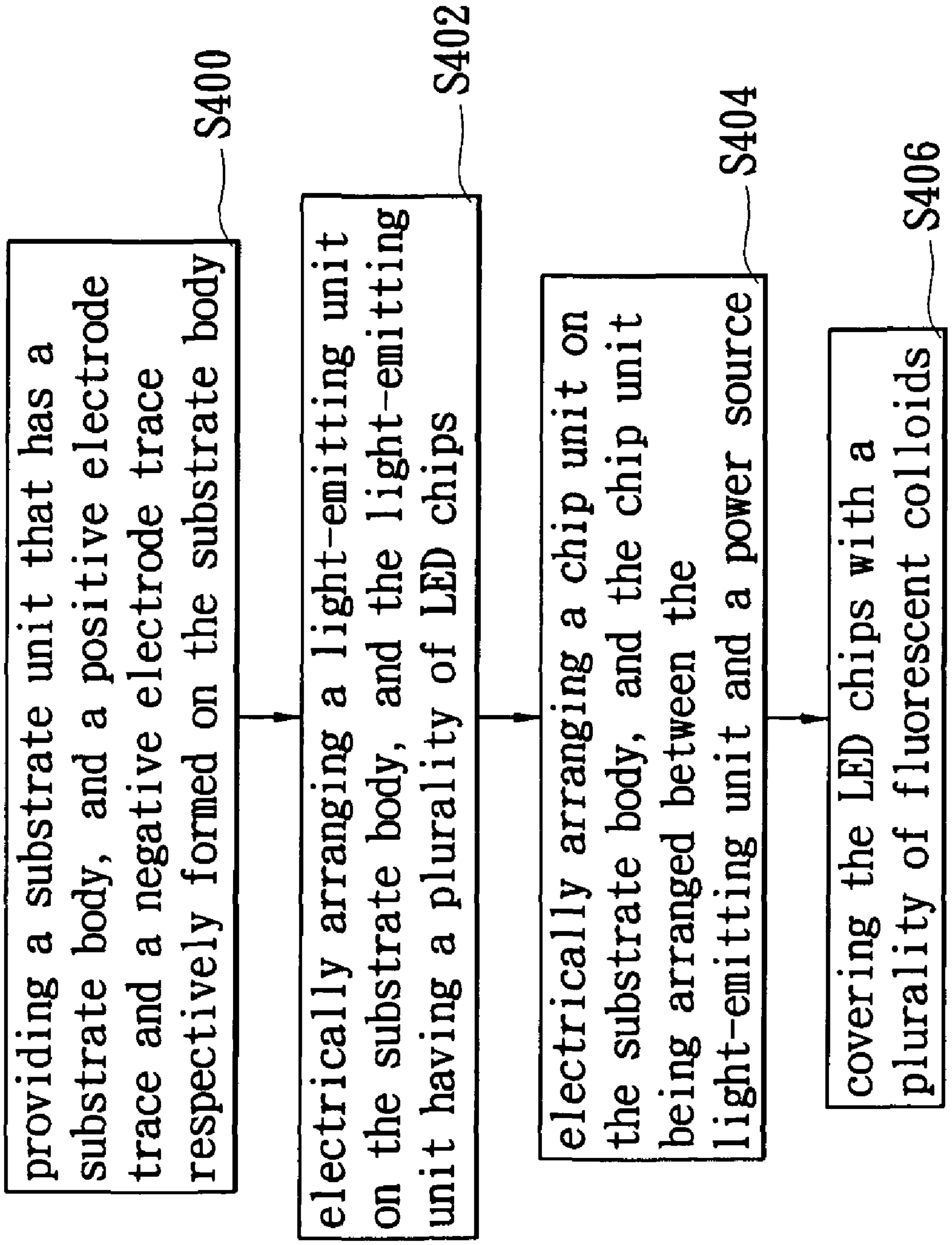
FIG. 5 is a flowchart of a method of making a chip package structure with multifunctional integrated chips according to the third embodiment of present invention.
Figure 5A:
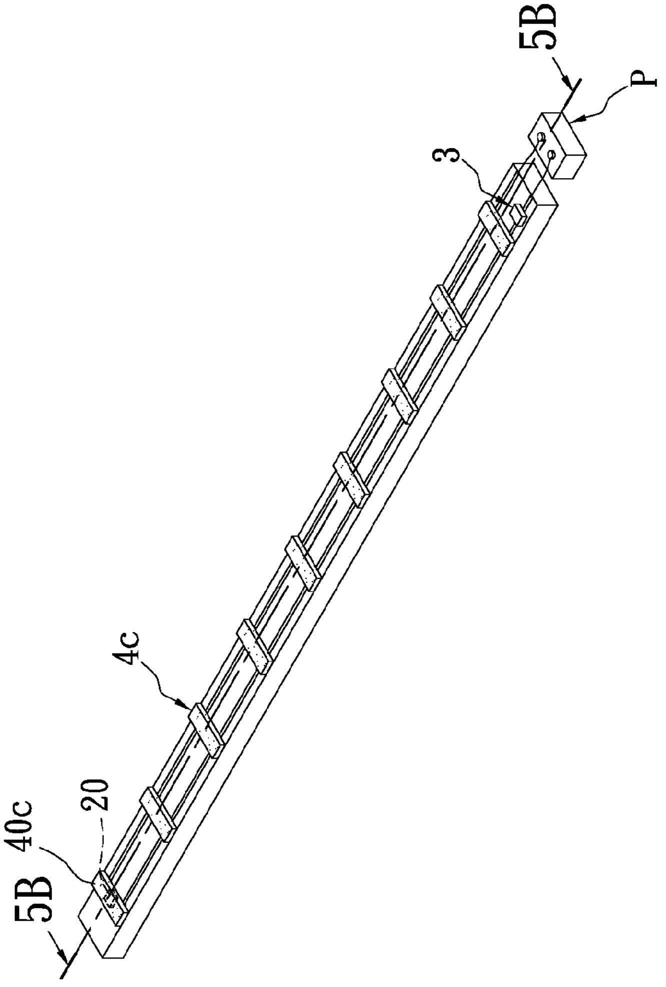
FIG. 5A is a schematic diagram of a chip package structure with multifunctional integrated chips according to the third embodiment of the present invention.
Figure 5B:
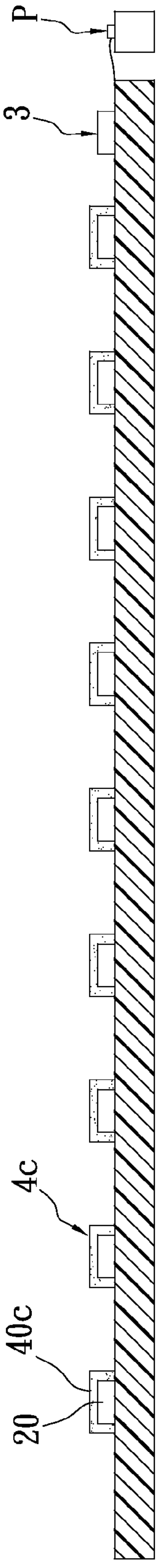
FIG. 5B is a cross-sectional view along line 5B-5B in FIG. 5A.

Referring to FIGS. 5 and 5A to 5B, the steps from S400 to S404 of the third embodiment are same as the steps from S200 to S204 of the first embodiment. In other words, the illustration of S400 is the same as FIG. 2A of the first embodiment, and the illustrations of S402, S404 are the same as FIG. 2B of the first embodiment. In addition, referring to FIGS. 5A and 5B, after the step of S404, the method of the third embodiment further includes: covering the LED chips 20 with a plurality of fluorescent colloids 40*c* (S406). The fluorescent colloids 40*c* are combined to form a package colloid unit 4*c*, and each fluorescent colloid 40*c* is formed by mixing silicon and fluorescent powders or mixing epoxy and fluorescent powders.

Referring to FIGS. 6, 6A to 6B and 6C, the steps from S500 to S504 of the fourth embodiment are same as the steps from S200 to S204 of the first embodiment. In other words, the illustration of S500 is the same as FIG. 2A of the first embodiment, and the illustrations of S502, S504 are the same as FIG. 2B of the first embodiment.

Figure 6:
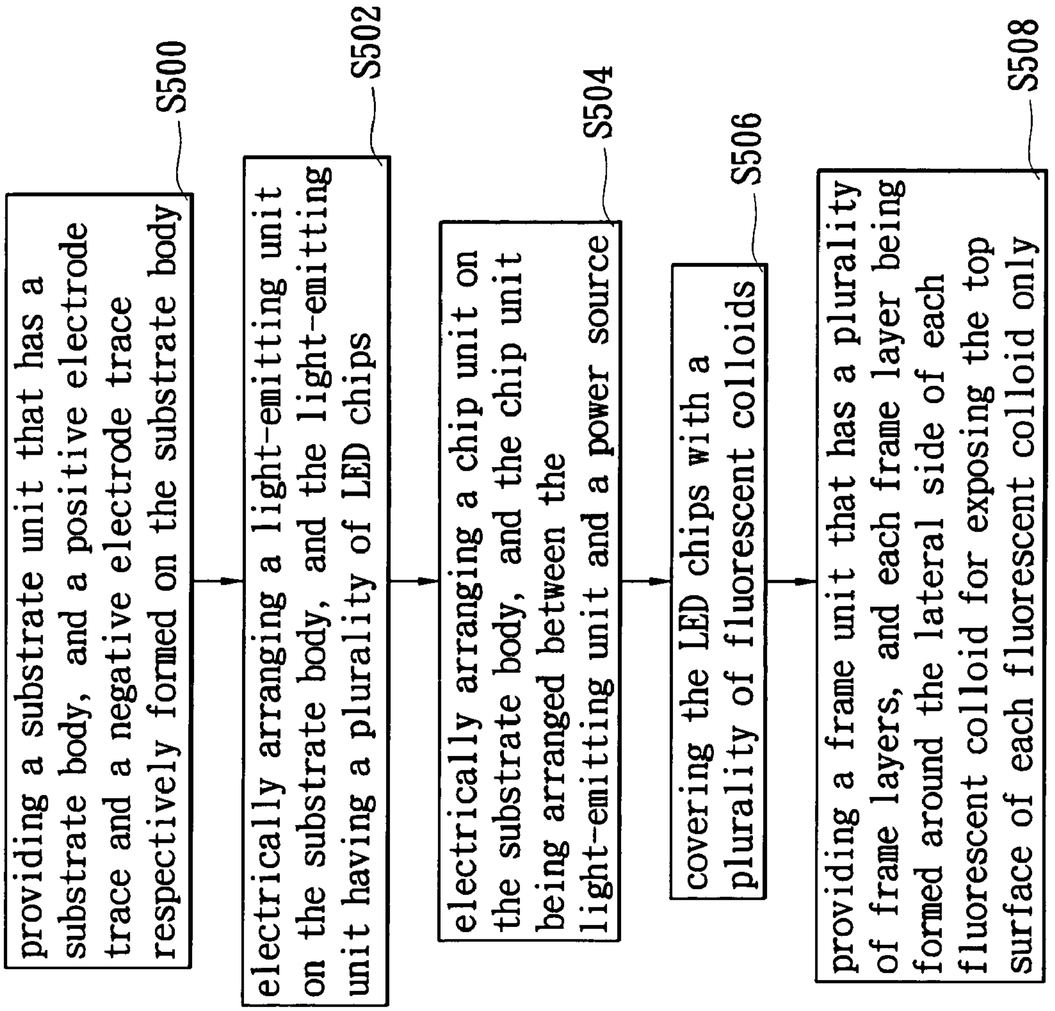
FIG. 6 is a flowchart of a method of making a chip package structure with multifunctional integrated chips according to the fourth embodiment of present invention.
Figures 6A, 6B, 6C:
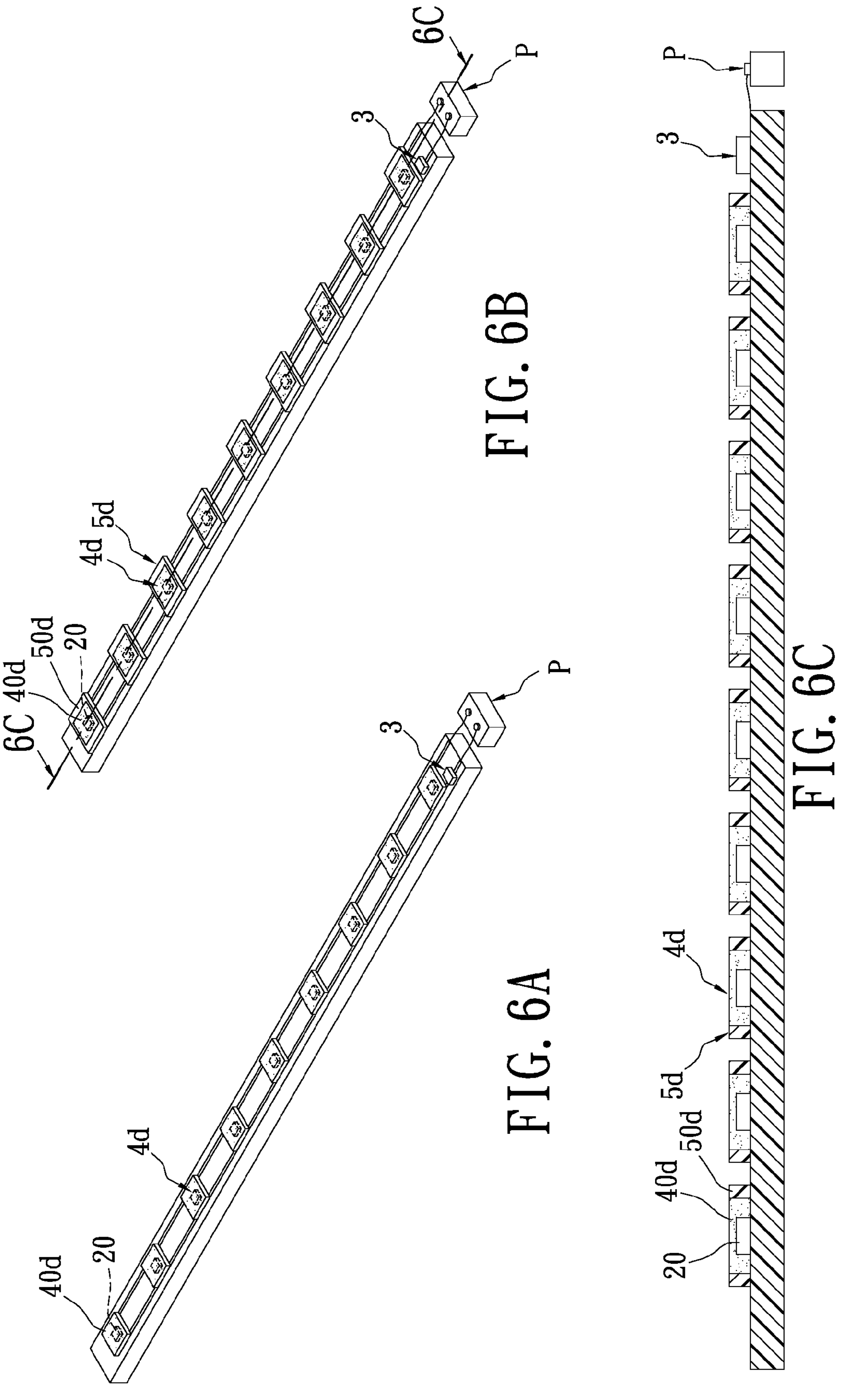
FIGS. 6A to 6B are schematic diagrams of a chip package structure with multifunctional integrated chips according to the fourth embodiment of the present invention, at different partial stages of the packaging processes, respectively.
FIG. 6C is a cross-sectional view along line 6C-6C in FIG. 6B.

Moreover, referring to FIGS. 6, 6A and 6B, after the step of S504, the method of the fourth embodiment further includes: covering the LED chips 20 with a plurality of fluorescent colloids 40*d* (S506), and then providing a frame unit 5*d* that has a plurality of frame layers 50*d*, and each frame layer 50*d* being formed around the lateral side of each fluorescent colloid 40*d* for exposing the top surface of each fluorescent colloid 40*d* only (S508). In addition, the fluorescent colloids 40*d* are combined to form a package colloid unit 4*d*, and the frame layers 50*d* are a plurality of opaque frame layers.

Referring to FIGS. 7, 7A to 7B and 7C, the steps from S600 to S604 of the fifth embodiment are same as the steps from S200 to S204 of the first embodiment. In other words, the illustration of S600 is the same as FIG. 2A of the first embodiment, and the illustrations of S602, S604 are the same as FIG. 2B of the first embodiment.

Figure 7:
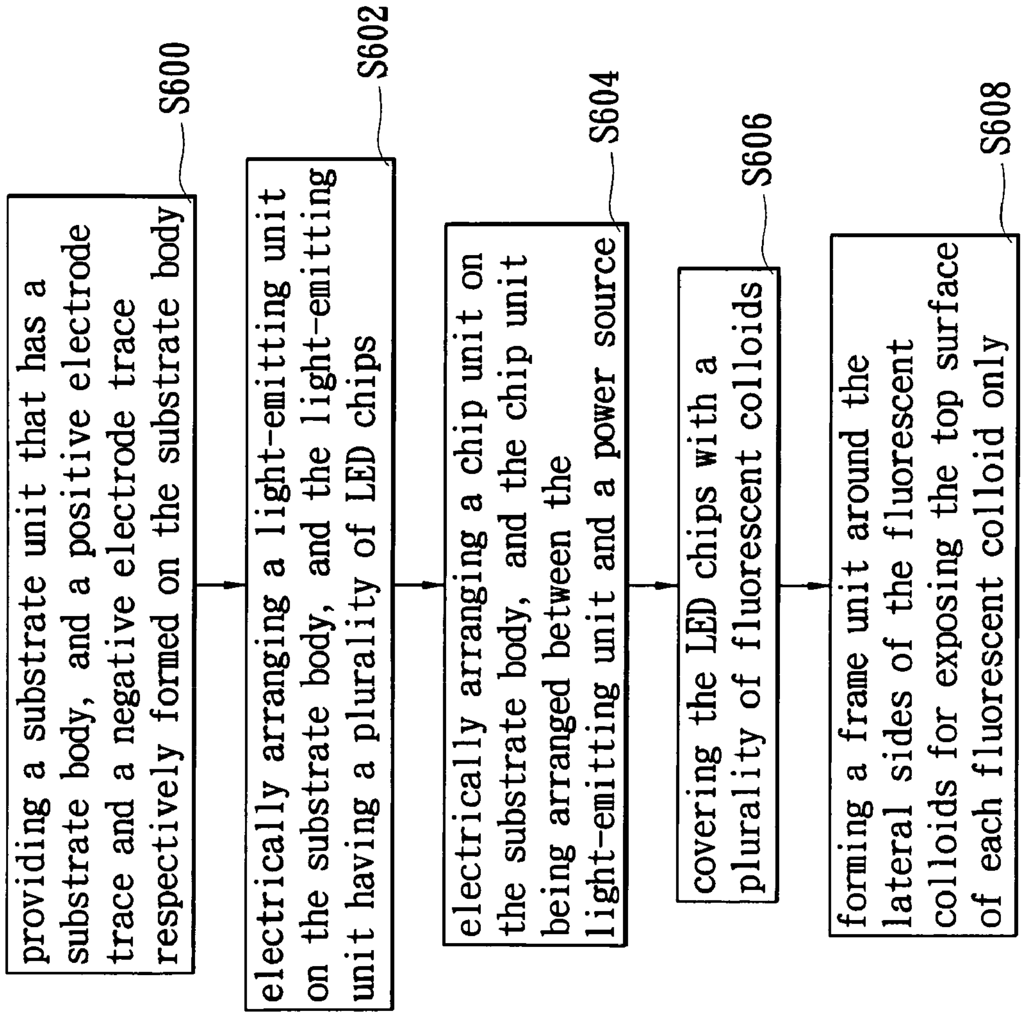
FIG. 7 is a flowchart of a method of making a chip package structure with multifunctional integrated chips according to the fifth embodiment of present invention.
Figure 7B:
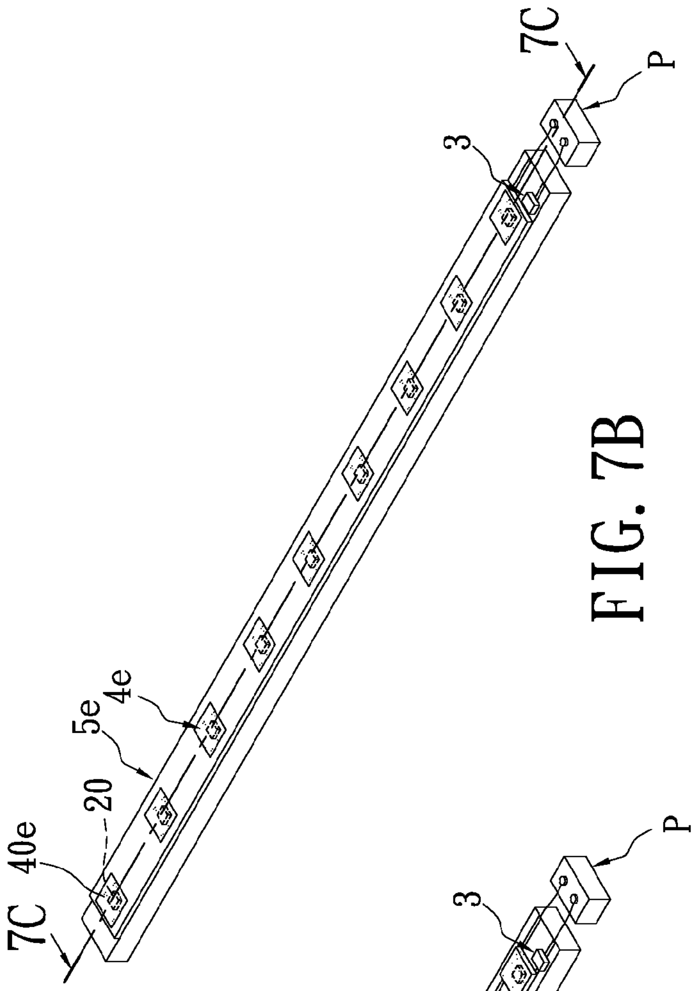
FIGS. 7A to 7B are schematic diagrams of a chip package structure with multifunctional integrated chips according to the fifth embodiment of the present invention, at different partial stages of the packaging processes, respectively.
Figure 7A:
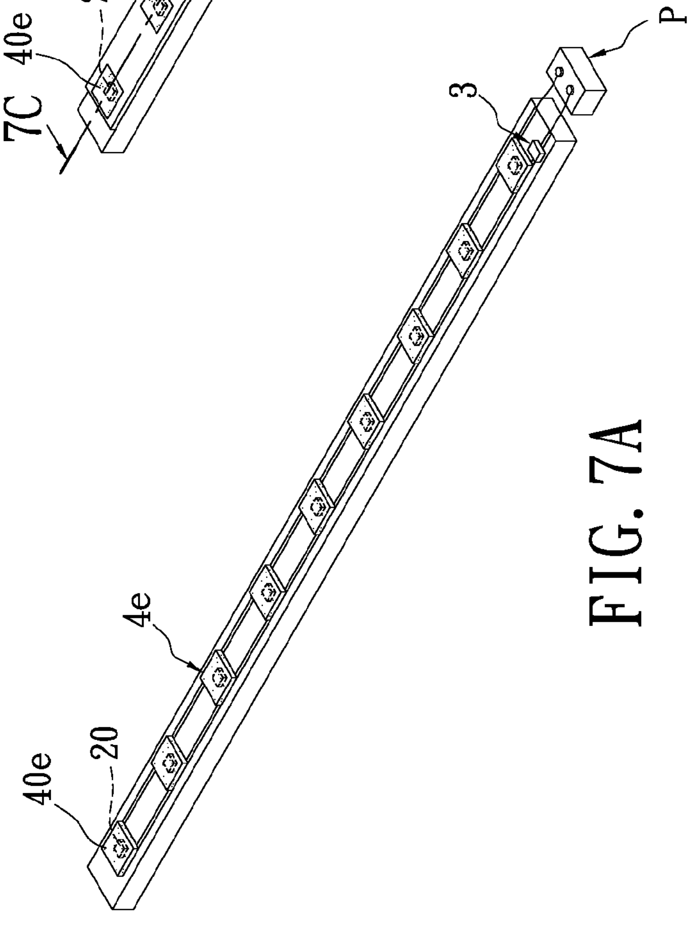
Figure 7C:
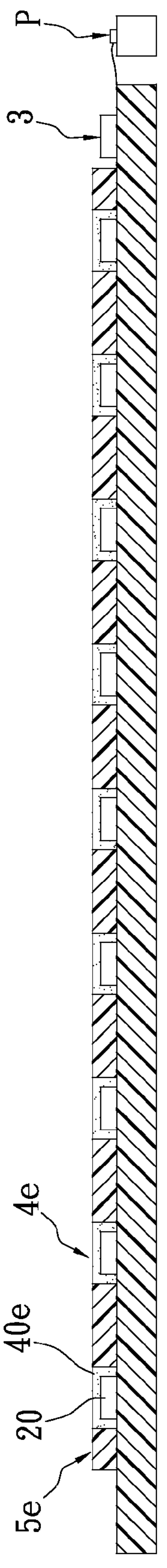
FIG. 7C is a cross-sectional view along line 7C-7C in FIG. 7B.

Moreover, referring to FIGS. 7, 7A and 7B, after the step of S604, the method of the fifth embodiment further includes: covering the LED chips 20 with a plurality of fluorescent colloids 40*e* (S606), and then forming a frame unit 5*e* around the lateral sides of the fluorescent colloids 40*e* for exposing the top surface of each fluorescent colloid 40*e* only. In addition, the fluorescent colloids 40*e* are combined to form a package colloid unit 4*e*, and the frame unit 5*e* is an opaque frame layer.

Referring to FIGS. 8, 8A to 8B and 8C, the steps from S700 to S704 of the sixth embodiment are same as the steps from S200 to S204 of the first embodiment. In other words, the illustration of S700 is the same as FIG. 2A of the first embodiment, and the illustrations of S702, S704 are the same as FIG. 2B of the first embodiment.

Figure 8:
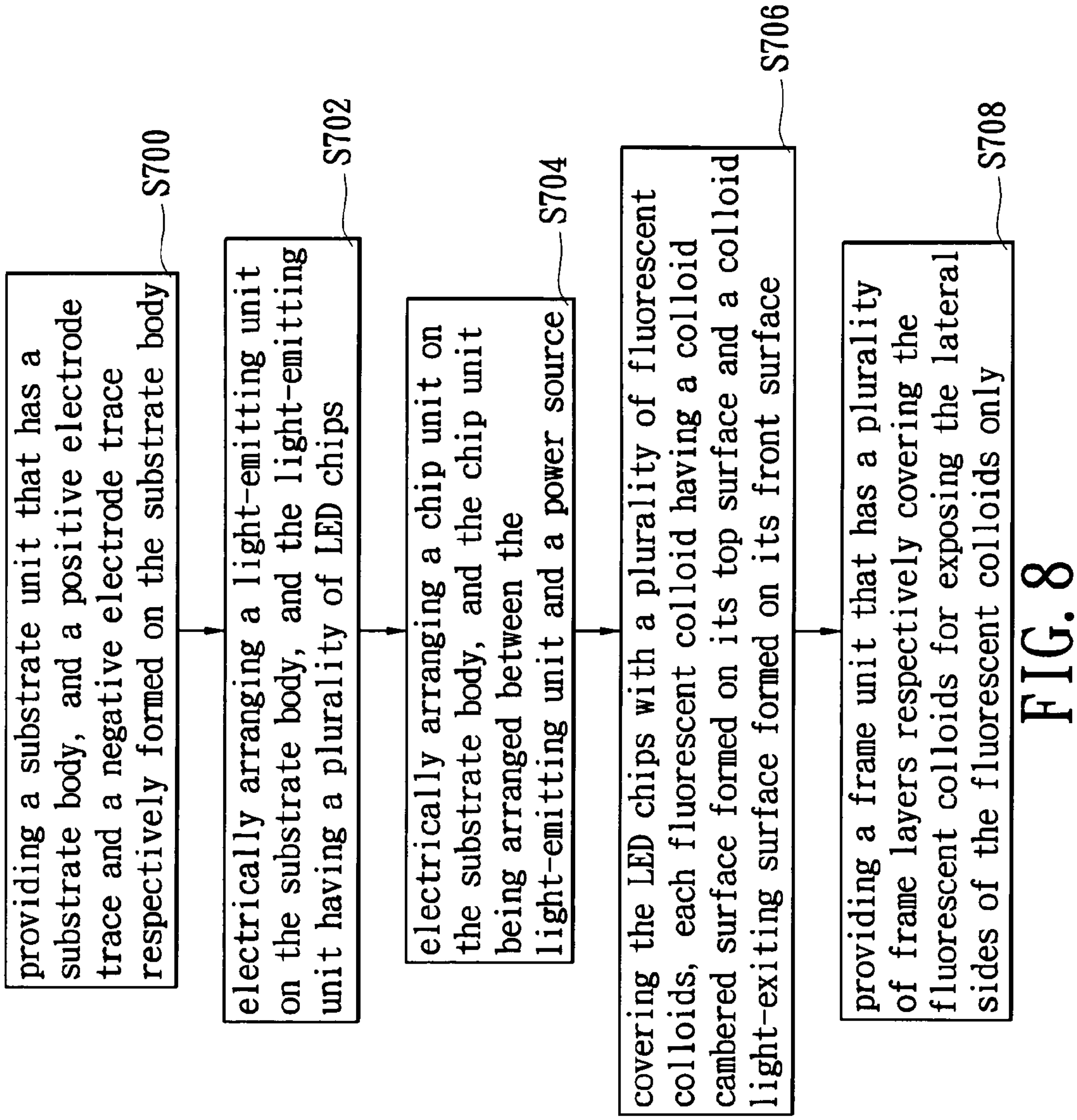
FIG. 8 is a flowchart of a method of making a chip package structure with multifunctional integrated chips according to the sixth embodiment of present invention.
Figure 8B:
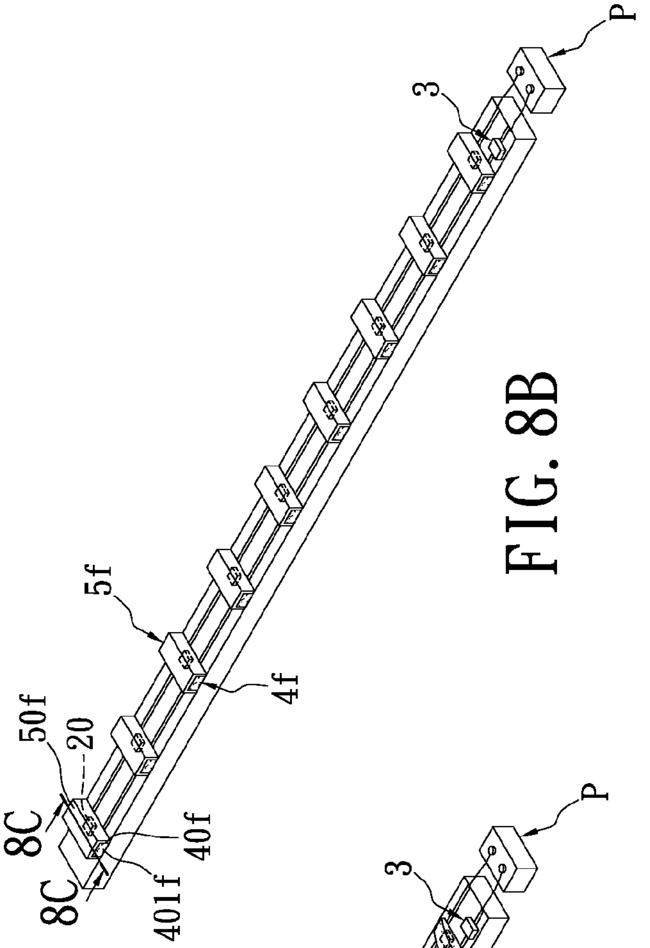
FIGS. 8A to 8B are schematic diagrams of a chip package structure with multifunctional integrated chips according to the sixth embodiment of the present invention, at different partial stages of the packaging processes, respectively.
Figure 8A:
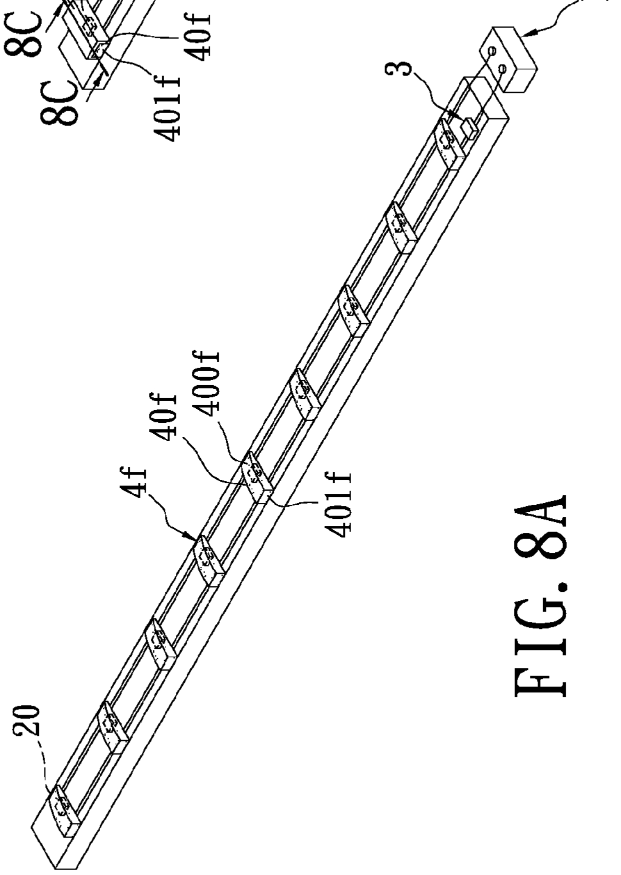

Moreover, referring to FIGS. 8 and 8A, after the step of S704, the method of the sixth embodiment further includes: covering the LED chips 20 with a plurality of fluorescent colloids 40*f*, each fluorescent colloid 40*f* having a colloid cambered surface 400*f* formed on its top surface and a colloid light-exiting surface 401*f* formed on its front surface (S706). In addition, the fluorescent colloids 40*f* are combined to form a package colloid unit 4*f*.

Figure 8C:
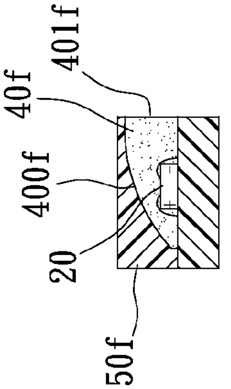
FIG. 8C is a cross-sectional view along line 8C-8C in FIG. 8B.

Referring to FIGS. 8, 8B and 8C, after the step of S706, the method of the sixth embodiment further includes: providing a frame unit 5*f* that has a plurality of frame layers 50*f* respectively covering the fluorescent colloids 40*f* for exposing the lateral sides of the fluorescent colloids 40*f* only (S708). In addition, the frame layers 50*f* are a plurality of opaque frame layers.

Referring to FIGS. 9, 9A to 9B and 9C, the steps from S800 to S804 of the seventh embodiment are same as the steps from S200 to S204 of the first embodiment. In other words, the illustration of S800 is the same as FIG. 2A of the first embodiment, and the illustrations of S802, S804 are the same as FIG. 2B of the first embodiment.

Figure 9:
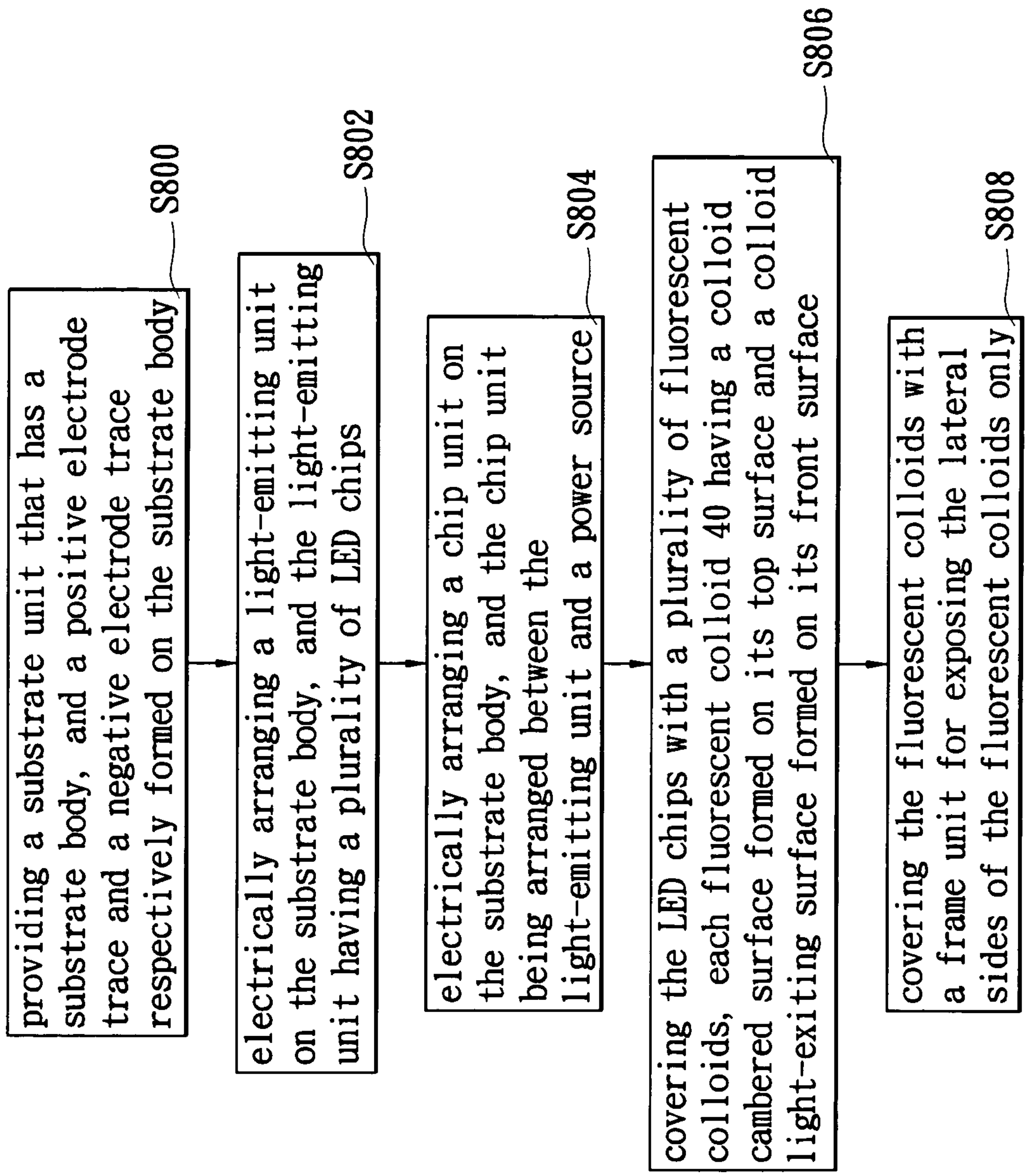
FIG. 9 is a flowchart of a method of making a chip package structure with multifunctional integrated chips according to the seventh embodiment of present invention.
Figure 9B:
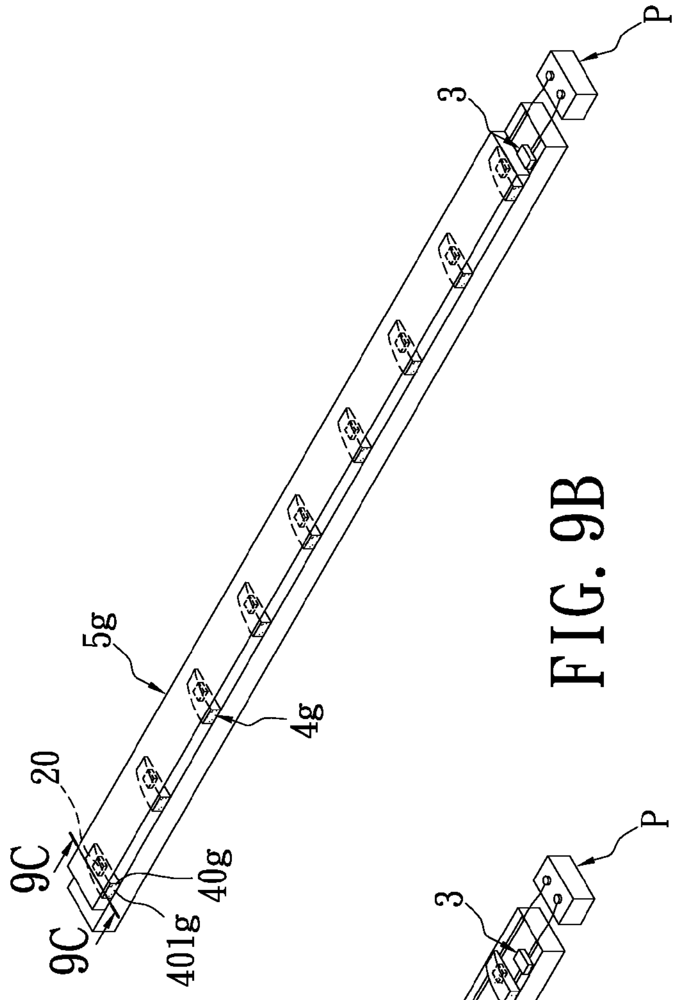
FIGS. 9A to 9B are schematic diagrams of a chip package structure with multifunctional integrated chips according to the seventh embodiment of the present invention, at different partial stages of the packaging processes, respectively.
Figure 9A:
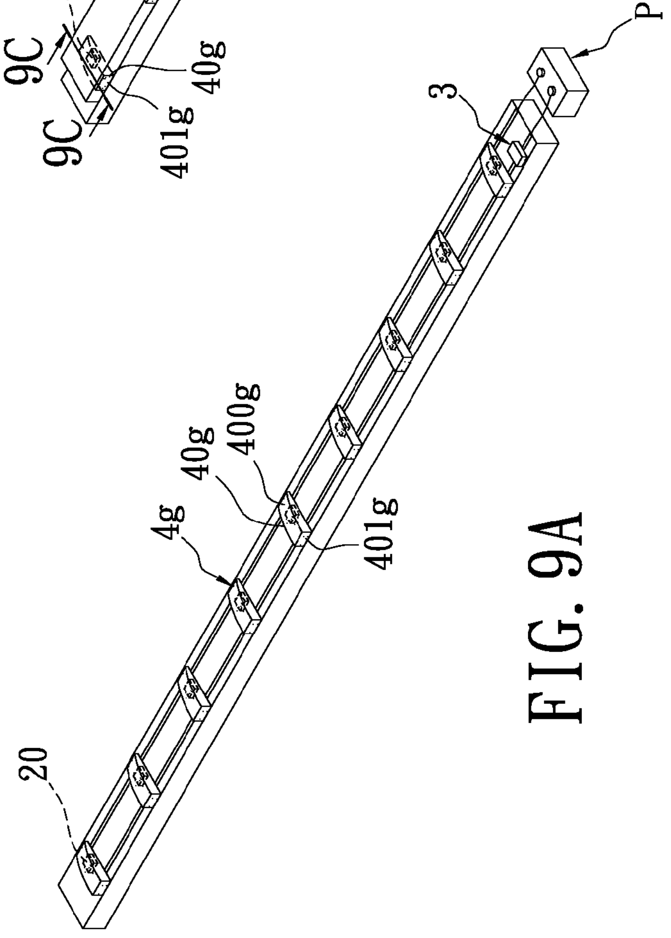

Moreover, referring to FIGS. 9 and 9A, after the step of S804, the method of the seventh embodiment further includes: covering the LED chips 20 with a plurality of fluorescent colloids 40*g*, each fluorescent colloid 40*g* having a colloid cambered surface 400*g* formed on its top surface and a colloid light-exiting surface 401*g* formed on its front surface (S806). In addition, the fluorescent colloids 40*g* are combined to form a package colloid unit 4*g*.

Figure 9C:
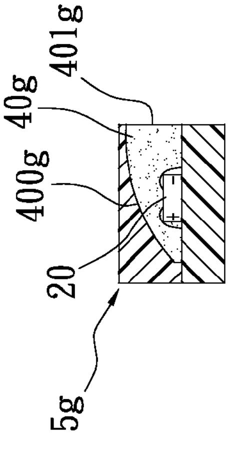
FIG. 9C is a cross-sectional view along line 9C-9C in FIG. 9B.

Referring to FIGS. 9, 9B and 9C, after the step of S806, the method of the seventh embodiment further includes: covering the fluorescent colloids 40*g* with a frame unit 5*g* for exposing the lateral sides of the fluorescent colloids 40*g* only (S808). In addition, the frame unit 5*g* is an opaque frame layer.

In conclusion, the present invention provides a chip unit for protecting LED chips integratedly set in a chip package structure to form the LED chip package structure with multifunctional integrated chips. Hence, the LED chips not only can be protected by the chip unit, but also can generate light source with high efficiency and increase usage life of the LED chip package structure.

Moreover, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

Therefore, the LED chips not only can be protected by the chip unit, but also can generate light source with high efficiency and increase usage life of the LED chip package structure. Furthermore, because the LED chips are arranged on a substrate body via an adhesive or a hot pressing method, the process for the LED chip package structure is simple and less time is needed for the manufacturing process.

Although the present invention has been described with reference to the preferred best modes thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A LED chip package structure, comprising:

an opaque substrate unit;

a light-emitting unit having a plurality of LED chips electrically connected to and arranged on the opaque substrate unit;

a multifunctional integrated chip unit electrically connected to and arranged on the opaque substrate unit, wherein the multifunctional integrated chip unit is arranged between the light-emitting unit and a power source, and the multifunctional integrated chip unit simultaneously corresponds to all of the LED chips of the light-emitting unit;

a package colloid unit having a plurality of fluorescent colloid bodies for respectively covering the LED chips, wherein each fluorescent colloid body has a colloid cambered surface and a colloid light-exiting surface respectively formed on a top surface and a front surface thereof, and the colloid cambered surface is extended upwardly and forwardly from a top surface of the opaque substrate unit and the colloid light-exiting surface is extended downwardly from a top end of the colloid cambered surface to the top surface of the opaque substrate unit; and a frame unit having an opaque frame layer formed on the opaque substrate unit to cover the fluorescent colloid bodies, wherein all of outer surfaces of each fluorescent colloid body are covered by each opaque frame layer except the colloid light-exiting surface of each fluorescent colloid body.

2. A LED chip package structure, comprising:

an opaque substrate unit;

a light-emitting unit having a plurality of LED chips electrically connected to and arranged on the opaque substrate unit;

a multifunctional integrated chip unit electrically connected to and arranged on the opaque substrate unit, wherein the multifunctional integrated chip unit is arranged between the light-emitting unit and a power source, and the multifunctional integrated chip unit simultaneously corresponds to all of the LED chips of the light-emitting unit;

a package colloid unit having a plurality of fluorescent colloid bodies for respectively covering the LED chips, wherein each fluorescent colloid body has a colloid cambered surface and a colloid light-exiting surface respectively formed on a top surface and a front surface thereof, and the colloid cambered surface is extended upwardly and forwardly from a top surface of the opaque substrate unit and the colloid light-exiting surface is extended downwardly from a top end of the colloid cambered surface to the top surface of the opaque substrate unit; and a frame unit having a plurality of opaque frame layers formed on the opaque substrate unit to respectively cover the fluorescent colloid bodies, and the opaque frame layers being separated from each other, wherein all of outer surfaces of each fluorescent colloid body are covered by each opaque frame layer except the colloid light-exiting surface of each fluorescent colloid body.

* * * * *